US011710530B2

(12) United States Patent
Ning

(10) Patent No.: US 11,710,530 B2
(45) Date of Patent: Jul. 25, 2023

(54) MEMORY DEVICE AND TEST CIRCUIT FOR THE SAME

(71) Applicant: Changxin Memory Technologies, Inc., Anhui (CN)

(72) Inventor: Shu-Liang Ning, Hefei (CN)

(73) Assignee: Changxin Memory Technologies, Inc., Hefei (CN)

(*) Notice: Subject to any disclaimer, the term of this patent is extended or adjusted under 35 U.S.C. 154(b) by 407 days.

(21) Appl. No.: 17/001,379

(22) Filed: Aug. 24, 2020

(65) Prior Publication Data

US 2020/0388345 A1 Dec. 10, 2020

Related U.S. Application Data

(63) Continuation of application No. PCT/CN2019/079938, filed on Mar. 27, 2019.

(30) Foreign Application Priority Data

Mar. 28, 2018 (CN) .......................... 201810266730.4

(51) Int. Cl.
*G11C 29/38* (2006.01)
*G11C 8/06* (2006.01)
(Continued)

(52) U.S. Cl.
CPC ................ *G11C 29/38* (2013.01); *G11C 8/06* (2013.01); *G11C 8/12* (2013.01); *G11C 29/14* (2013.01); *H03K 19/20* (2013.01)

(58) Field of Classification Search
CPC ......... G11C 29/38; G11C 29/14; G11C 29/18; G11C 29/46; G11C 29/56; G11C 8/06; G11C 8/12; H03K 19/20
See application file for complete search history.

(56) References Cited

U.S. PATENT DOCUMENTS 7,586,801 B2    9/2009  Do et al.
8,429,319 B2    4/2013  Do
              (Continued)

FOREIGN PATENT DOCUMENTS

CN    1945734 A    4/2007
CN    1983452 A    6/2007
              (Continued)

OTHER PUBLICATIONS

PCT International Search Report and the Written Opinion dated Jun. 12, 2019, issued in related International Application No. PCT/CN2019/079938 (7 pages).

*Primary Examiner* — Cynthia Britt
*Assistant Examiner* — Rong Tang
(74) *Attorney, Agent, or Firm* — Sheppard, Mullin, Richter & Hampton LLP

(57) ABSTRACT

The present disclosure provides a memory device, wherein: an address latch can output a block selection control signal according to a block selection enable signal; a test mode selection unit can output a test mode selection signal according to a test mode selection instruction signal; a block selection unit outputs a block selection signal according to a mode selection signal and a block selection enable signal; when the memory enters a first test mode according to the test mode selection signal, an output buffer disables some of the input/output ports, and sequentially outputs the first input/output data and the second input/output data through un-disabled the input/output ports. The memory device according to the present disclosure can occupy less input/output ports of a test machine.

13 Claims, 8 Drawing Sheets

(51) Int. Cl.
*G11C 8/12* (2006.01)
*G11C 29/14* (2006.01)
*H03K 19/20* (2006.01)

(56) References Cited

U.S. PATENT DOCUMENTS

| | | | | |
|---|---|---|---|---|
| 9,373,417 | B2* | 6/2016 | Tong | .............. G11C 29/36 |
| 2007/0195633 | A1* | 8/2007 | Ahn | .............. G11C 7/1075 |
| | | | | 365/230.05 |
| 2008/0094890 | A1* | 4/2008 | Kim | .............. G11C 29/26 |
| | | | | 365/185.2 |
| 2008/0181037 | A1 | 7/2008 | Do et al. | |

FOREIGN PATENT DOCUMENTS

| | | | |
|---|---|---|---|
| CN | 104078082 | A | 10/2014 |
| CN | 108447522 | A | 8/2018 |
| CN | 108564982 | A | 9/2018 |
| CN | 207833931 | U | 9/2018 |

\* cited by examiner

MEMORY DEVICE AND TEST CIRCUIT FOR THE SAME

CROSS-REFERENCE TO RELATED APPLICATIONS

This application is a continuation application of International Patent Application No. PCT/CN2019/079938, filed on Mar. 27, 2019, which is based on and claims priority of Chinese Patent Application No. 201810266730.4, filed with the State Intellectual Property Office (SIPO) of the People's Republic China on Mar. 28, 2018. The above-referenced applications are incorporated herein by reference in their entirety.

TECHNICAL FIELD

The present disclosure relates to the field of semiconductor memories, and in particular to a memory device and a test circuit for the memory device.

BACKGROUND

A semi-conductor memory is a memory that uses integrated circuit as the storage medium. FIG. 1 shows a circuit diagram of a 16-bit memory device 100. The memory device 100 includes two 8-bit storage modules 141 and 142. The memory device 100 further includes an instruction logic unit 170 and an address latch 110. The instruction logic unit 170 outputs an internal control signal under the control of external signals Output Enable (OE), Row Address Strobe (RAS)/, Colum Address Strobe (CAS)/ and Write Enable (WE)/. The address latch 130 latches address signals ADD [0:13] and outputs row address signals ROW[0:13] and column address signals COL[0:9] to the storage modules 141 and 142. The storage modules 141 and 142 decode the row address signals ROW[0:13] and the column address signals COL[0:9] and output data. An output buffer 151 caches the data in the storage module 141, and an output buffer 152 caches the data in the storage module 142.

FIG. 2 shows a schematic diagram of a test circuit of the memory device frequently used in the prior art. A plurality of memory devices 100 (DUT'1, DUT'2, DUT'3, DUT'4, DUT'5, DUT'6 . . . ) under test are connected to a test machine 10. Each of the RAS/ port, CAS/ port, WE/ port, and OE port of the first memory device DUT'1 needs to occupy one of the input/output ports IO1[0:3] of the test machine 10 respectively, and address ports A[0:13] need to occupy 14 input/output ports IO1[4:17] of the test machine 10, and data ports DQ[0:15] need to occupy 16 input/output ports IO1[18:33] of the test machine 10. Every memory device 100 requires similar connections. When there are six memory devices, 204 input/output ports of the test machine 10 are occupied. Therefore, the test circuit of the prior art needs to occupy a lot of IO ports of the test machine, resulting in a waste of test resources and an increase in test costs.

SUMMARY

Embodiments of the present disclosure provide a memory device and a test circuit for the memory device, to solve or alleviate one or more technical problems in the prior art.

As one aspect of the embodiments of the present disclosure, the embodiments of the present disclosure provide a memory device, including:

an address latch having an address signal input port for receiving an address signal and a block selection enable signal input port for receiving a block selection enable signal, wherein the address latch outputs an address control signal and a block selection control signal;

a test mode selection unit having a test mode selection instruction input port for receiving a test mode selection instruction signal, wherein the test mode selection unit outputs a test mode selection signal according to the test mode selection instruction signal;

a block selection unit connected to the address latch and the test mode selection unit and configured to output a block selection signal according to the block selection control signal and the test mode selection signal;

a first storage module connected to the block selection unit and the address latch and configured to decode the address control signal and output a first input/output data when the first storage module is enabled according to the block selection signal;

a second storage module connected to the block selection unit and the address latch and configured to decode the address control signal and output a second input/output data when the second storage module is enabled according to the block selection signal; and an output buffer having a plurality of input/output ports, wherein the output buffer is connected to the test mode selection unit, and to the first storage module and the second storage module, and when the memory device enters a first test mode according to the test mode selection signal, the output buffer disables some of the input/output ports and sequentially outputs the first input/output data and the second input/output data through input/output ports that are not disabled.

Further, the memory device further includes:

a test mode read-write logic unit connected between the first storage module and the output buffer, and between the second storage module and the output buffer, and connected to the address latch and the test mode selection unit, and configured to perform logic processes on the first input/output data and the second input/output data according to the block selection control signal and the test mode selection signal to obtain a logic processing result;

wherein when the memory device enters a second test mode according to the test mode selection signal, the output buffer disables some of the input/output ports and outputs the logic processing result from the input/output ports that are not disabled.

Further, the second test mode includes a first test sub-mode and a second test sub-mode, when the memory device enters a first test sub-mode according to the test mode selection signal, the test mode read-write logic unit is configured to perform logic exclusive-OR (XOR) on the first input/output data and the second input/output data with an expected data respectively to obtain a first logic processing result;

when the memory device enters a second test sub-mode according to the test mode selection signal, the test mode read-write logic unit is configured to perform logic XOR on the first input/output data and the second input/output data to obtain a second logic processing result.

Further, the test mode read-write logic unit includes:

a register for outputting the expected data;

a first data comparator connected to the register, the first storage module, and the second storage module, and configured to perform logic XOR on the first input/output data and the second input/output data with the expected data respectively to obtain the first logic processing result;

a second data comparator connected to the first storage module and the second storage module, and configured to perform logic XOR on the first input/output data and the second input/output data to obtain the second logic processing result; and a multiplexer, an input port of the multiplexer being connected to the first data comparator, the second data comparator, and the test mode selection unit, and an output port of the multiplexer being connected to the output buffer, the multiplexer being configured to output any one of the first logic processing result and the second logic processing result under the control of the test mode selection signal.

Further, the output buffer includes:

a first buffer group comprising a plurality of first buffers, input ports of the first buffers being connected to the first storage module, and output ports of the plurality of first buffers forming a first group of input/output ports, wherein the output ports of the first buffers are un-disabled;

a second buffer group comprising a plurality of second buffers, input ports of the second buffers being connected to the first storage module, and output ports of the plurality of second buffers forming a second group of input/output ports, wherein the output ports of the second buffers are disabled according to the test mode selection signal; and a third buffer group comprising a plurality of third buffers, input ports of the third buffers being connected to the second storage module, and output ports of the plurality of third buffers forming a third group of input/output ports, wherein the output ports of the third buffers are disabled according to the test mode selection signal.

Further, the test mode selection instruction signal includes an initial test mode signal, a fuse signal, and a test mode control signal; the initial test mode signal is from an internal circuit of the memory device, the test mode control signal is from an external test signal; and the test mode control signal has an enabling priority higher than that of the fuse signal, and the fuse signal has an enabling priority higher than that of the initial test mode signal.

Further, the test mode selection unit includes at least one test mode selection subunit including:

a fuse circuit for outputting the fuse signal and a fuse enable signal according to the fuse state;

a first multiplexer having a first input port and a second input port for inputting the initial test mode signal and the fuse signal, respectively, the first multiplexer being used for outputting any one of the fuse signal and the initial test mode signal according to the fuse enable signal;

a test mode control unit for outputting the test mode control signal and the test mode enable signal; and a second multiplexer connected to the first multiplexer and the test mode control unit and configured to output any one of the test mode control signal and an output signal of the first multiplexer as the test mode selection signal according to the test mode enable signal.

Further, when the memory device enters a third test mode according to the test mode selection signal, the output buffer enables all the input/output ports and outputs the first input/output data and the second input/output data through all the input/output ports.

Further, the test mode selection signal includes a first test mode selection signal and a second test mode selection signal; and the block selection unit includes:

a logic AND gate connected to the test mode selection unit and configured to perform logic AND on an inversion of the first test mode selection signal and the second test mode selection signal and then output same;

a first logic NAND gate connected to the address latch and the logic AND gate and configured to perform logic NAND on the block selection control signal and an output of the logic AND gate and then output the first block selection signal; and a second logic NAND gate connected to the address latch and the logic AND gate and configured to perform logic NAND on an inversion of the block selection control signal and an output of the logic AND gate and then output the second block selection signal.

As another aspect of the embodiments of the present disclosure, the embodiments of the present disclosure further provide a test circuit for a memory device, including a plurality of foregoing memory devices and a test machine connected to some of the input/output ports of the memory devices.

Further, the test machine includes a block selection enable signal output port for outputting the block selection enable signal; the block selection enable signal input ports of the plurality of memory devices are connected together to form a first connection point, and the first connection point is connected to the block selection enable signal output port of the test machine.

Further, the memory device has a row address strobe signal port, a column address strobe signal port, and a write enable signal port; the row address strobe signal ports of the plurality of memory devices are connected together to form a second connection point; the column address strobe signal ports of the plurality of memory devices are connected together to form a third connection point; the write enable signal ports of the plurality of memory devices are connected together to form a fourth connection point; and the second connection point, the third connection point, and the fourth connection point are connected to an input/output port of the test machine, respectively.

By means of the foregoing technical solutions, the embodiments of the present disclosure can share drive resources of the test machine and occupy less input/output ports of the test machine.

The foregoing summary is merely for the purpose of description, and is not intended to limit the scope of the present disclosure. In addition to the aspects, embodiments and features described above, other aspects, embodiments and features of the present disclosure will be readily apparent with reference to the accompanying drawings and the detailed description below.

BRIEF DESCRIPTION OF THE DRAWINGS

In the drawings, unless otherwise specified, the same reference numerals in a plurality of drawings are used to refer to the same or similar components or elements. The drawings are not necessarily drawn to scale. It should be understood that the drawings merely describe some embodiments disclosed in the present disclosure, and are not intended to limit the scope of the present disclosure.

DESCRIPTION OF REFERENCE NUMERALS

Figure 1:
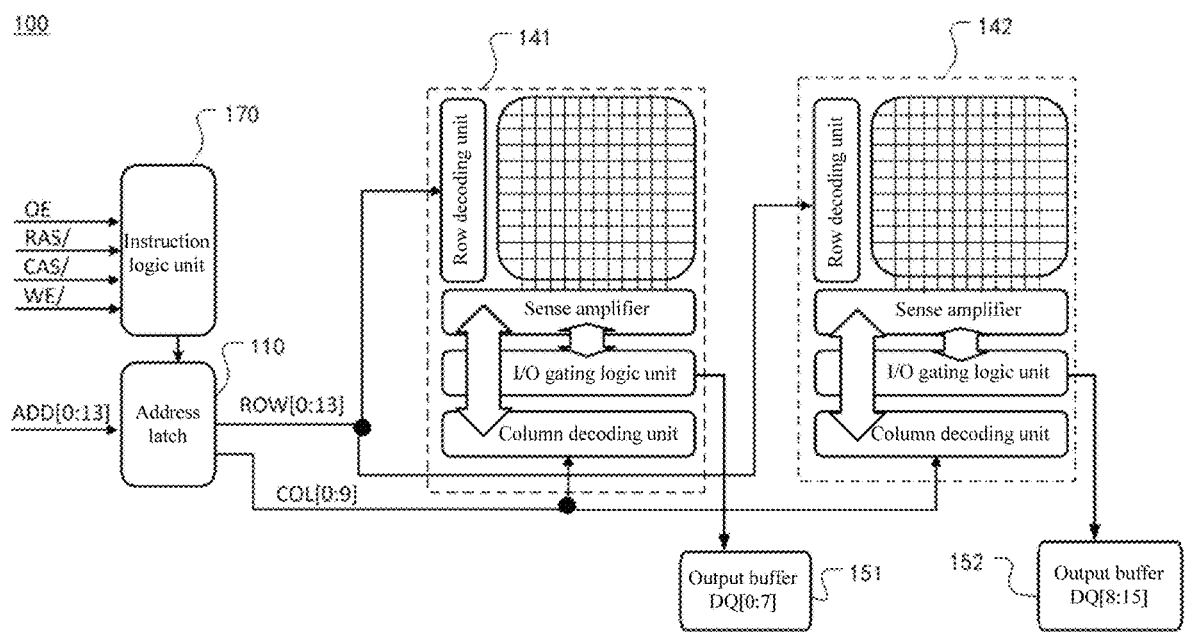
FIG. 1 is a circuit diagram of a memory device in the prior art.
Figure 2:
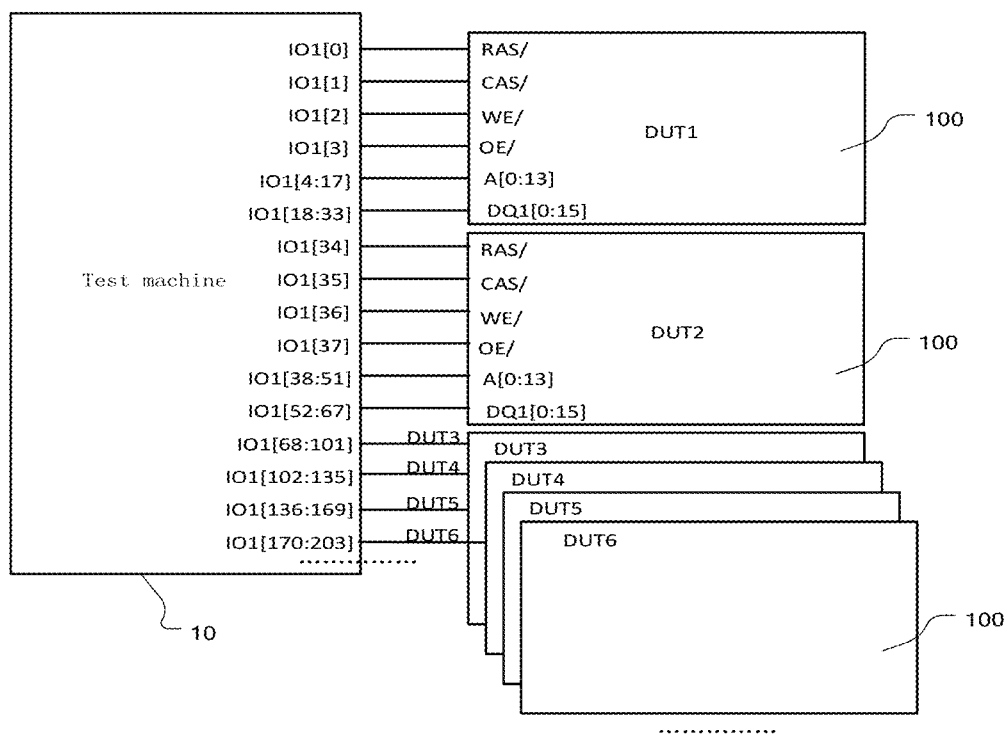
FIG. 2 is a test circuit diagram of a memory device in the prior art.

In the prior art:
100: memory device; 110: address latch; 141: first storage module;
142: second storage module; 151, 152: output buffer;
170: instruction logic unit; 10: test machine.
In the present disclosure:
200: memory device;
210: address latch; 220: test mode selection unit;
230: block selection unit; 241: first storage module;
242: second storage module; 250: output buffer;
260: TMRW logic unit; 270: instruction logic unit;
221: first test mode selection subunit; 222: second test mode selection subunit;
221A: first fuse circuit; 222A: second fuse circuit;
221C: first test mode selection control unit; 222C: second test mode selection control unit;
221B: first multiplexer; 221D: second multiplexer;
222B: third multiplexer; 222D fourth multiplexer;
231: first logic NAND gate; 232: second logic NAND gate; 233: fourth logic AND gate;
251: first buffer group; 251A: first buffer; 252: second buffer group;
252A: second buffer; 253: third buffer group; 253A: third buffer;
254: inverter; 255: logic NOR gate; 261: first data comparator;
262: second data comparator; 263: register; 264: fifth multiplexer;
265: first logic AND gate; 266: second logic AND gate; 267: third logic AND gate;
20: test machine.

DETAIL DESCRIPTION OF THE EMBODIMENTS

The following sections only briefly describe some exemplary embodiments. As recognized by a person of ordinary skill in the art, the described embodiments can be modified in various different ways without departing from the spirit and scope of the present disclosure. Accordingly, the drawings and description are considered to be exemplary in essence rather than restrictive.

In the description of the present disclosure, it should be understood that the orientation or positional relationships indicated by the terms such as "center", "longitudinal", "lateral", "length", "width", "thickness", "upper", "lower", "front", "rear", "left", "right", "vertical", "horizontal", "top", "bottom", "inside", "outside", "clockwise", "counter-clockwise", "axial", "radial", and "circumferential" are based on the orientation or positional relationships shown in the drawings, and are merely for the convenience of describing the present disclosure and simplifying the description, and are not intended to indicate or imply that the described devices or elements necessarily have a particular orientation, or are constructed and operated in a particular orientation. Therefore, they should not be construed to limit the present disclosure.

Moreover, the terms "first" and "second" are used for descriptive purposes only, not to be construed to indicate or imply relative importance or implicitly indicate the number of technical features. Therefore, the features defined by "first" and "second" may explicitly or implicitly include one or more of the features. In the present disclosure, the term "a plurality of" means two or more, unless otherwise specifically defined.

In the present disclosure, unless otherwise expressly specified or limited, the terms such as "install", "connected with", "connected to", and "fix" should be comprehended in a broad sense. For example, these terms may be comprehended as being fixedly connected, detachably connected or integrally connected; mechanically connected or electrically connected or communicated; or directly connected or indirectly connected through an intermediate medium, or in an internal communication between two elements or interactive relationship of two elements. Specific meaning of the foregoing terms in the present disclosure may be understood by a person of ordinary skill in the art according to specific circumstances.

In the present disclosure, unless otherwise expressly specified or limited, the first feature being "above" or "below" the second feature can include the situation that the first feature is in direct contact with the second feature, and the situation that the first feature is not in contact with the second feature directly, but through another feature between them. Moreover, the first feature being "above", "over" and "on" the second feature may mean that the first feature is right above or obliquely above the second feature, or merely indicate that the height of the first feature is higher than that of the second feature. The first feature being "below", "under" and "underneath" the second feature may mean that the first feature is right under or obliquely below the second feature, or merely indicate that the height of the first feature is less than that of the second feature.

The following disclosure provides many different embodiments or examples for implementing different structures of the present disclosure. To simplify the present disclosure, components and arrangements of specific examples are described below. Certainly, they are merely exemplary embodiments and are not intended to limit the present disclosure. In addition, the present disclosure can repeat reference number and/or reference letters in different examples, and such repetitions are for the purpose of simplicity and clarity, and do not indicate the relationship between various discussed embodiments and/or arrangements.

An embodiment of the present disclosure provides a memory device. By increasing a test mode selection unit and a block selection unit, less input/output ports of the test machine are occupied when the memory device is under test, and different test modes can be performed on the memory device.

Figure 3:
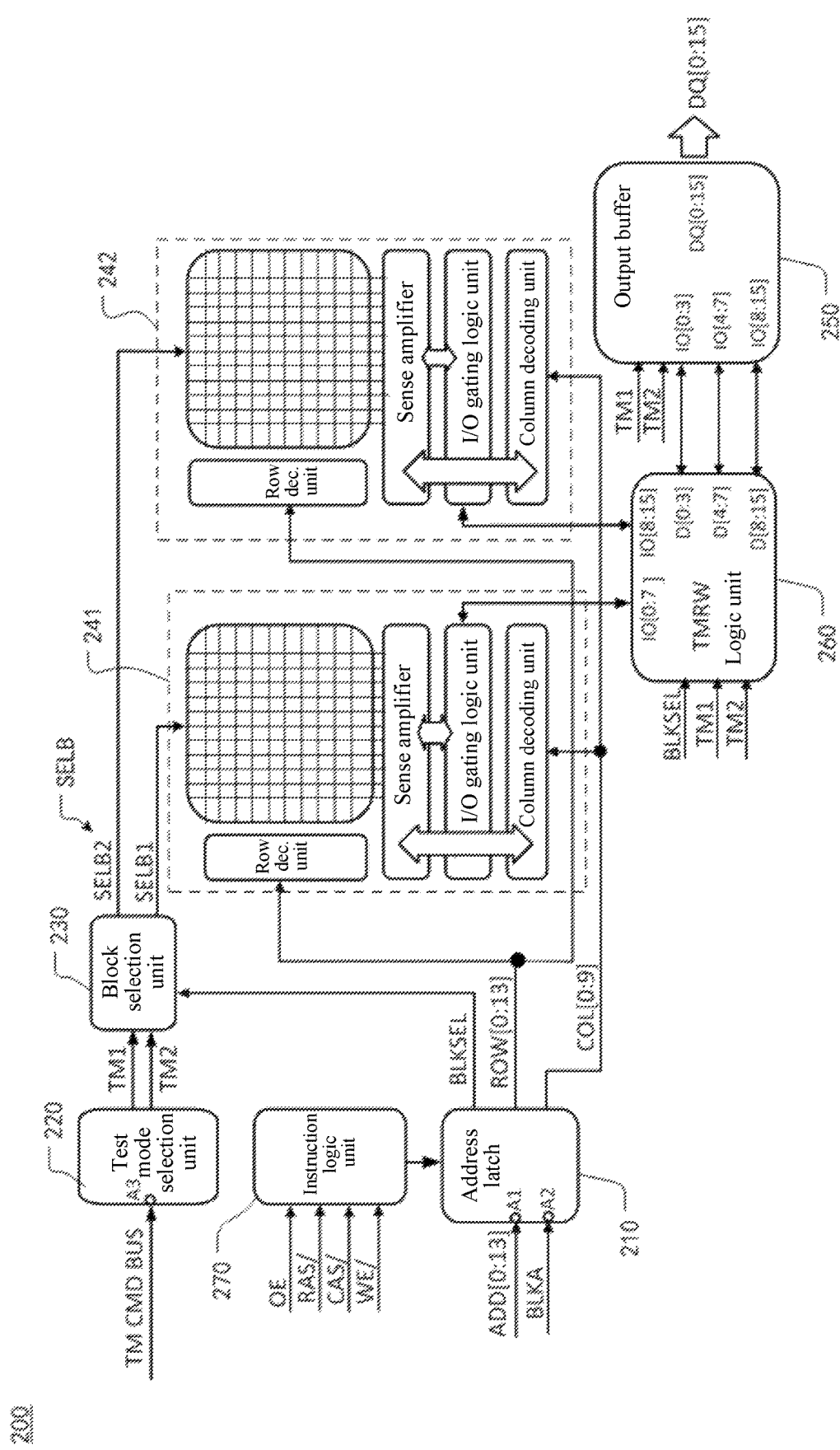
FIG. 3 is a circuit diagram of a memory device in some embodiments of the present disclosure.

FIG. 3 shows a memory device 200 of this embodiment, including an address latch 210, a test mode selection unit 220, a block selection unit 230, a first storage module 241, a second storage module 242, and an output buffer 250.

The address latch 210 has an address signal input port A1 and a block selection enable signal input port A2. The address signal input port A1 receives address signals ADD [0:13], and the block selection enable signal input port A2 receives a block selection enable signal BLKA. The address latch 210 outputs a block selection control signal BLKSEL and an address control signal according to the address signals ADD[0:13] and the block selection enable signal BLKA. The address control signal includes column address signals COL[0:9] and row address signals ROW[0:13].

A test mode selection unit 220 has a test mode selection instruction input port A3. The test mode selection instruction input port A3 receives a test mode selection instruction signal TM CMD BUS. The test mode selection unit 220 may be one or more test mode selection subunits, each test mode selection subunit outputs a test mode selection signal according to the test mode selection instruction signal TM CMD BUS, and the number of test mode selection subunits depends on the number of required test modes.

The following embodiments are described by taking two test mode selection subunits as an example, that is, the test mode selection unit 220 includes a first test mode selection subunit 221 and a second test mode selection subunit 222. The first test mode selection subunit 221 is configured to output a first test mode selection signal TM1 according to the test mode selection instruction signal TM CMD BUS, and the second test mode selection subunit 222 is configured to output a second test mode selection signal TM2 according to the test mode selection instruction signal TM CMD BUS.

The test mode selection instruction signal TM CMD BUS can include initial test mode signals (a first initial test mode signal default1 and a second initial test mode signal default2), fuse signals (a first fuse signal Fuse1 and a second fuse signal Fuse2), test mode selection control signals (a first test mode selection control signal TM CTRL1 and a second test mode selection control signal TM CTRL2). The initial test mode signals are from an internal circuit of a memory device 200, that is, the initial test mode signal is generated by default upon manufacture of the memory device 200. For example, the initial test mode signal can be from an internal working voltage VDD of the memory device 200, such that is set to be a high level signal, or can also be from a ground voltage VSS of the memory device 200, such that is set to be a low level signal.

Figure 4:
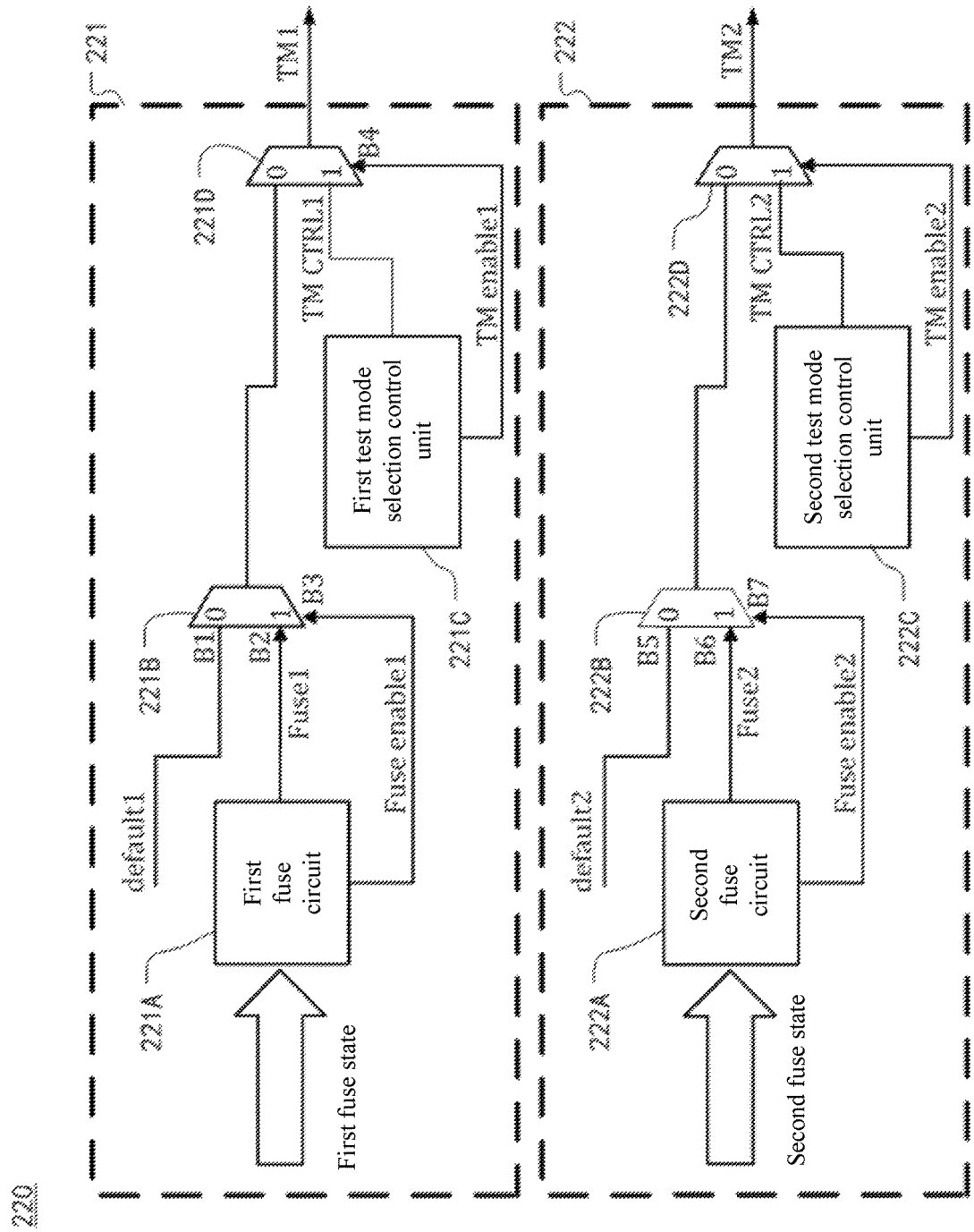
FIG. 4 is a circuit diagram of a test mode selection unit of a memory device in some embodiments of the present disclosure.

As shown in FIG. 4, the first test mode selection subunit 221 includes a first fuse circuit 221A, a first multiplexer 221B, a first test mode selection control unit 221C, and a second multiplexer 221D.

The first fuse circuit 221A outputs a first fuse signal Fuse1 and a first fuse enable signal Fuse enable1 according to a first fuse state, wherein the first fuse state includes a level signal that is changed or generated due to fuse failure. A fuse is physically located on a chip where the memory device 200 is located.

The first multiplexer 221B has a first input end B1 and a second input end B2. The first input end B1 is logic "0" for inputting the first initial test mode signal default1, and the second input end B2 is logic "1" for inputting the first fuse signal Fuse1. An strobe signal port B3 of the first multiplexer 221B inputs the first fuse enable signal Fuse enable1 for outputting the first fuse signal Fuse1 when the first fuse enable signal Fuse enable1 outputs a logic "1", and outputting the first initial test mode signal default1 when the first fuse enable signal Fuse enable1 outputs a logic "0". That is, the first fuse signal Fuse1 has an enabling priority higher than that of the first initial test mode signal default1.

The first test mode selection control unit 221C is configured to output a first test mode selection control signal TM CTRL1 and a first TM enable signal TM enable1. The first test mode selection control signal TM CTRL1 is from an external test signal, and can be configured according to test requirements of a user, that is, the first test mode selection control unit 221C can be disposed at an external test circuit or an external test machine.

The second multiplexer 221D is connected to the first multiplexer 221B and the first test mode selection control unit 221C. Specifically, the logic "0" input port of the second multiplexer 221D is connected to the output port of the first multiplexer 221B, and the logic "1" input port of the second multiplexer 221D is connected to the output port of the first test mode selection control unit 221C. A strobe signal port B4 of the second multiplexer 221D inputs a first TM enable signal TM enable1 for outputting the first test mode selection control signal TM CTRL1 as a first test mode selection signal TM1 when the first TM enable signal TM enable1 outputs a logic "1", and outputting the output signal of the first multiplexer 221B as the first test mode selection signal TM1 when the first TM enable signal TM enable1 outputs a logic "0", that is, outputting the first fuse signal Fuse1 or the first initial test mode signal default1. That is, the enabling priority of the first test mode selection control signal TM CTRL1 is higher than that of the first fuse signal Fuse1.

Continue referring to FIG. 4, the second test mode selection subunit 222 includes a second fuse circuit 222A, a third multiplexer 222B, a second test mode selection control unit 222C, and a fourth multiplexer 222D.

The second fuse circuit 222A outputs a second fuse signal Fuse2 and a second fuse enable signal Fuse enable2 according to a second fuse state. The third multiplexer 222B has a third input port B5 for inputting the second initial test mode signal default2 and a fourth input port B6 for inputting the second fuse signal Fuse2. The second test mode selection control unit 222C outputs a second test mode selection control signal TM CTRL2 and a second TM enable signal TM enable2. The fourth multiplexer 222D is connected to the third multiplexer 222B and the second test mode selection control unit 222C for outputting the second test mode selection control signal TM CTRL2 as a second test mode selection signal TM2 when the second TM enable signal TM enable2 outputs a logic "1", and outputting the output signal of the third multiplexer 222B as the second test mode selection signal TM2 when the second TM enable signal TM enable2 outputs a logic "0", that is, outputting the second fuse signal Fuse2 or the second initial test mode default2. For specific working principle of the second test mode selection subunit 222, refer to that of the first test mode selection subunit 221.

The memory device 200 is configured with a default test mode according to the circuit design requirements upon the production. We can change the test mode of the memory device 200 by changing the fuse state. When the fuse state cannot be changed, the test mode of the memory device 200 can be changed through a test mode selection control signal of an external test circuit or test machine.

As shown in FIG. 3, the block selection unit 230 is connected to the address latch 210 and the test mode selection unit 220, and is configured to output a block selection signal SELB according to the block selection control signal BLKSEL, the first test mode selection signal TM1, and the second test mode selection signal TM2, wherein the block selection signal SELB includes a first block selection signal SELB1 and a second block selection signal SELB2.

The first storage module 241 is connected to the block selection unit 230 and the address latch 210. The first storage module 241 decodes column address signals COL[0:9] and row address signals ROW[0:13], and outputs first input/output data IO[0:7] when the first storage module 241 is enabled under the control of the first block selection signal SELB1. The second storage module 242 is connected to the block selection unit 230 and the address latch 210. The second storage module 242 decodes column address signals COL[0:9] and row address signals ROW[0:13] and outputs second input/output data IO[8:15] when the second storage module 242 is enabled under the control of the second block selection signal SELB2.

Figure 5:
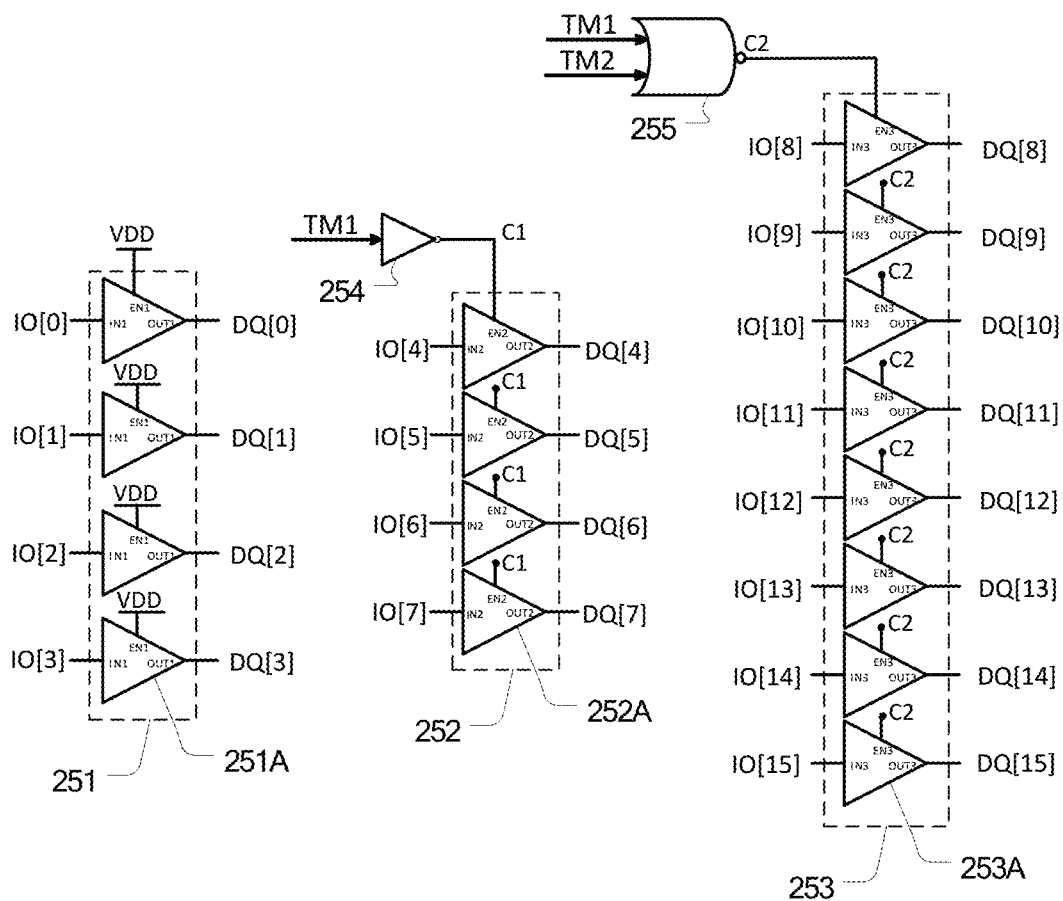
FIG. 5 is a circuit diagram of an output buffer of a memory device in some embodiments of the present disclosure.

As shown in FIG. 3 and FIG. 5, the output buffer 250 is communicated to the first storage module 241, the second storage module 242 and the test mode selection unit 220, and includes a plurality of input/output ports DQ, which can be divided into a first group of input/output ports DQ[0:3], a second group of input/output ports DQ[4:7], and a third group of input/output ports DQ[8:15].

When the memory device 200 enters the first test mode, the output buffer 250 sets the third group of input/output ports DQ[8:15] to a disabled state, and sequentially outputs the first input/output data IO[0:7] and the second input/output data IO[8:15] from the input/output ports DQ[0:7] that are not disabled.

When the memory device 200 enters the second test mode, the output buffer 250 sets the second group of input/output ports DQ[4:7] and the third group of input/output ports DQ[8:15] to the disabled state, and outputs the output data of the TMRW logic unit 260 from the input/output ports (DQ[0:3]) that are not disabled.

When the memory device 200 enters the third test mode, the output buffer 250 sets all the input/output ports DQ[0:15] to an un-disabled state, and outputs the first input/output data IO[0:7] and the second input/output data IO[8:15] from all the input/output ports DQ[0:15].

FIG. 5 shows a circuit diagram of the output buffer 250 of this embodiment. The output buffer 250 includes a first buffer group 251, a second buffer group 252, a third buffer group 253, an inverter 254, and a logic NOR gate 255.

The first buffer group 251 includes a plurality of first buffers 251A. An input port IN1 of the first buffer 251A is connected to the first storage module 241, an output port OUT1 of the first buffer 251A forms one of the first group of input/output ports DQ[0:3], and an enable port EN1 of the first buffer 251A is connected to a power voltage VDD, that is, the first buffer group 251 makes the first group of input/output ports DQ[0:3] enabled under the action of the power voltage VDD.

The inverter 254 is connected to the test mode selection unit 220 for outputting an inversion of the first test mode selection signal TM1. The second buffer group 252 includes a plurality of second buffers 252A. An input port IN2 of the second buffer 252A is connected to the first storage module 241, an output port OUT2 of the second buffer 252A forms one of the second group of input/output ports DQ[4:7], and an enable port EN2 of the second buffer 252A is connected to an output port C1 of the inverter 254, that is, when the first test mode selection signal TM1 of the second buffer group 252 outputs the logic "1", the second group of input/output ports DQ[4:7] is in the disabled state (i.e., an off state).

The logic NOR gate 255 is connected to the test mode selection unit 220, and configured to perform logic NOR on the first test mode selection signal TM1 and the second test mode selection signal TM2 and then output same. The third buffer group 253 includes a plurality of third buffers 253A. An input port IN3 of the third buffer 253A is connected to the second storage module 242, an output port OUT3 of the third buffer 253A forms one of the third group of input/output ports DQ[8:15], and an enable port EN3 of the third buffer 253A is connected to an output port C2 of the logic NOR gate 255, that is, when neither first test mode selection signal TM1 nor the second test mode selection signal TM2 outputs the logic "0", the third buffer group 253 makes the third group of input/output ports DQ[8:15] in the disabled state.

Preferably, as shown in FIG. 3, the memory device 200 of this embodiment further includes a TMRW logic unit 260 connected between the first storage module 241 and the output buffer 250, connected between the second storage module 242 and the output buffer 250, and connected to the address latch 210 and the test mode selection unit 230. The TMRW logic unit 260 is configured to perform different logic processes on the first input/output data IO[0:7] and the second input/output data [8:15] according to the block selection control signal BLKSEL, the first test mode selection signal TM1, and the second test mode selection signal TM2.

Figure 6:
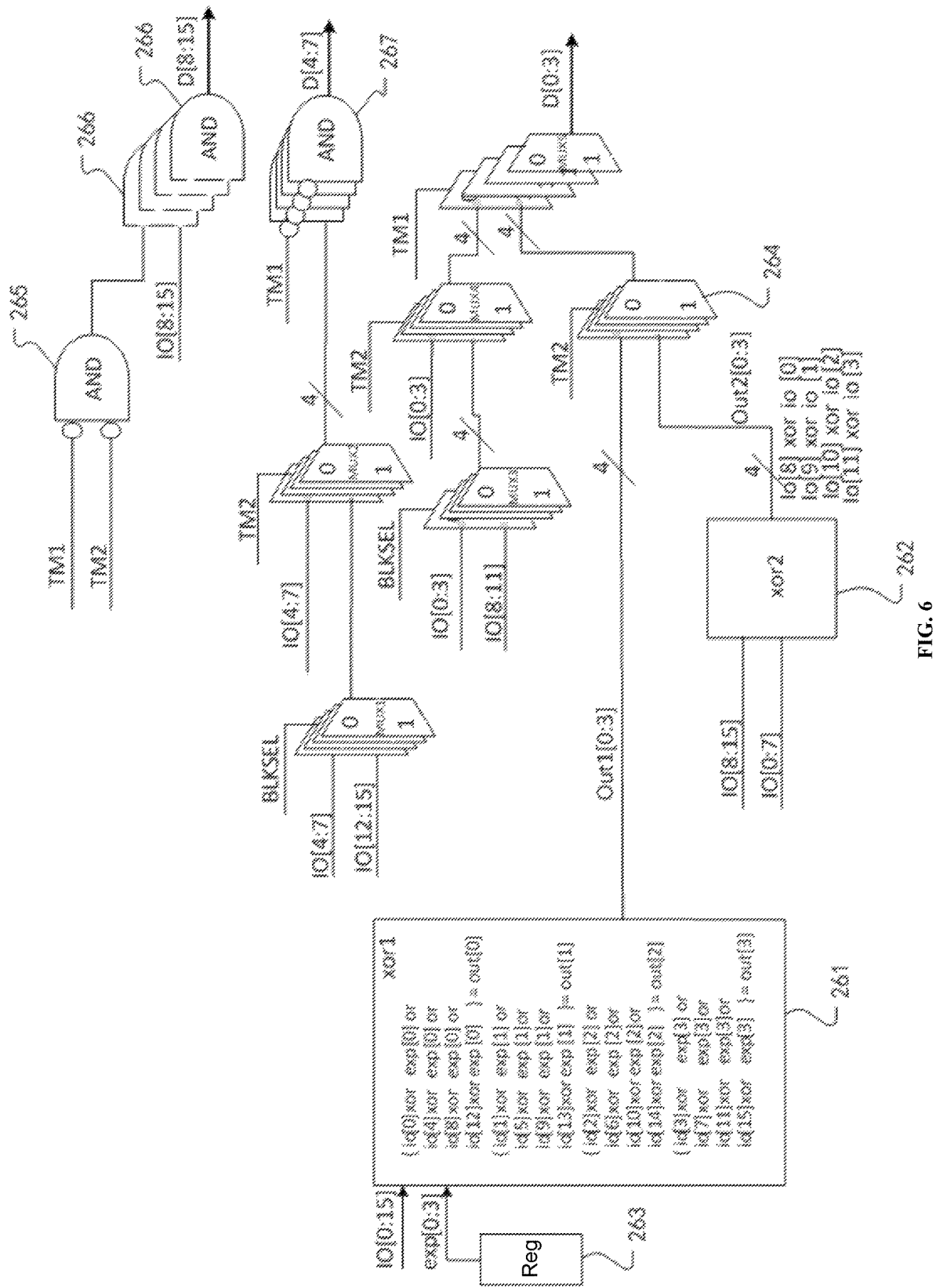
FIG. 6 is a circuit diagram of a test mode read-write (TMRW) logic unit of a memory device in some embodiments of the present disclosure.

FIG. 6 is a circuit diagram of the TMRW logic unit 260. The TMRW logic unit 260 includes a first logic AND gate 265, a plurality of second logic AND gates 266, a plurality of sixth multiplexers MUX1, a plurality of seventh multiplexers MUX2, a plurality of third logic AND gates 267, a register 263, a first data comparator 261, a second data comparator 262, and a fifth multiplexer 264.

The first logic AND gate 265 is configured to perform logic AND on an inversion signal of the first test mode selection signal TM1 and an inversion signal of the second test mode selection signal TM2, and then output to the plurality of second logic AND gates 266. Each bit of data in the second input/output data IO[8:15] is input to one of the second logic AND gates 266. The second logic AND gate 266 performs logic AND on each bit of data in the second input/output data IO[8:15] and the output result of the first logic AND gate 265 respectively and then outputs data D[8:15], wherein the data D[8:15] is cached and output via the third group of input/output ports DQ[8:15] of the output buffer 250.

The plurality of sixth multiplexers MUX1 outputs the first input/output data IO[4:7] or the second input/output data IO[12:15] to the plurality of seventh multiplexers MUX2 under the control of the block selection control signal BLKSEL. The plurality of seventh multiplexers MUX2 outputs the first input/output data IO[4:7] or the second input/output data IO[12:15] to the plurality of third logic AND gates 267 under the control of the second test mode selection signal TM2. The plurality of third logic AND gate 267 uses the first input/output data IO[4:7] (BLKSEL=0) or the second input/output data IO[12:15] (BLKSEL=1) as data D[4:7] when the first test mode selection signal TM1 outputs the logic "0", and the data D[4:7] is cached and output via the second group of input/output ports DQ[4:7] of the output buffer 250, and the second group of input/output ports DQ[4:7] of the output buffer 250 is disabled when the first test mode selection signal TM1 outputs the logic "1". Refer to Table 1.

TABLE 1

| Test mode | TM1 | TM2 | DQ[0:3] | DQ[4:7] | DQ[8:15] |
|---|---|---|---|---|---|
| Third test mode | 0 | 0 | IO[0:3] | IO[4:7] | IO[8:15] |
| First test mode | 0 | 1 | IO [0:3], BLKSEL = 0<br>IO [8:11], BLKSEL = 1 | IO [4:7], BLKSEL = 0<br>IO [12:15], BLKSEL = 1 | Disabled |

TABLE 1-continued

| Test mode | | TM1 | TM2 | DQ[0:3] | DQ[4:7] | DQ[8:15] |
|---|---|---|---|---|---|---|
| Second test mode | Second test sub-mode | 1 | 0 | 4:1 compression | Disabled | Disabled |
| | First test sub-mode | 1 | 1 | 2:1 compression | Disabled | Disabled |

A plurality of eighth multiplexers MUX3 outputs the first input/output data IO[0:3] or the second input/output data IO[8:11] to a plurality of ninth multiplexers MUX4 under the control of the block selection control signal BLKSEL. The plurality of ninth multiplexers MUX4 outputs the first input/output data IO[0:3] or the second input/output data IO[8:11] to a plurality of tenth multiplexers MUX5 under the control of the second test mode selection signal TM2.

That is, if TM1=0 and TM2=0, the plurality of tenth multiplexers MUX5 uses the first input/output data IO[0:3] (BLKSEL=0) or the second input/output data IO[8:11] (BLKSEL=1) as data D[0:3] when the first test mode selection signal TM1 outputs the logic "0", and the data D[0:3] is cached and output via a first group of input/output ports DQ[0:3] of the output buffer 250. A second group of input/output ports DQ[4:7] of the output buffer 250 is disabled when the first test mode selection signal TM1 outputs the logic "1". Refer to Table 1.

The register 263 is configured to output expected data exp[0:3]. The first data comparator 261 is connected to the register 263, the first storage module 241, and the second storage module 242, and configured to perform logic XOR process on the expected data exp[0:3] with the first input/output data IO[0:7] and the second input/output data IO[8:15] respectively to obtain a first logic processing result Out1[0:3], that is, the first data comparator 261 compresses the data in a 4:1 ratio.

The second data comparator 262 is connected to the first storage module 241 and the second storage module 242, and configured to perform logic XOR process on the first input/output data IO[0:7] and the second input/output data IO[8:15] to obtain a second logic processing result Out2[0:3], that is, the second data comparator 262 outputs data effectively compressed in a 2:1 ratio.

A plurality of fifth multiplexers 264 is connected to the first data comparator 261, the second data comparator 262, and the test mode selection unit 220, and configured to output the first logic processing result Out1[0:3] of the first data comparator 261 or the second logic processing result Out2[0:3] of the second data comparator 262 to the plurality of tenth multiplexers MUX5 under the control of the second test mode selection signal TM2.

Figure 7:
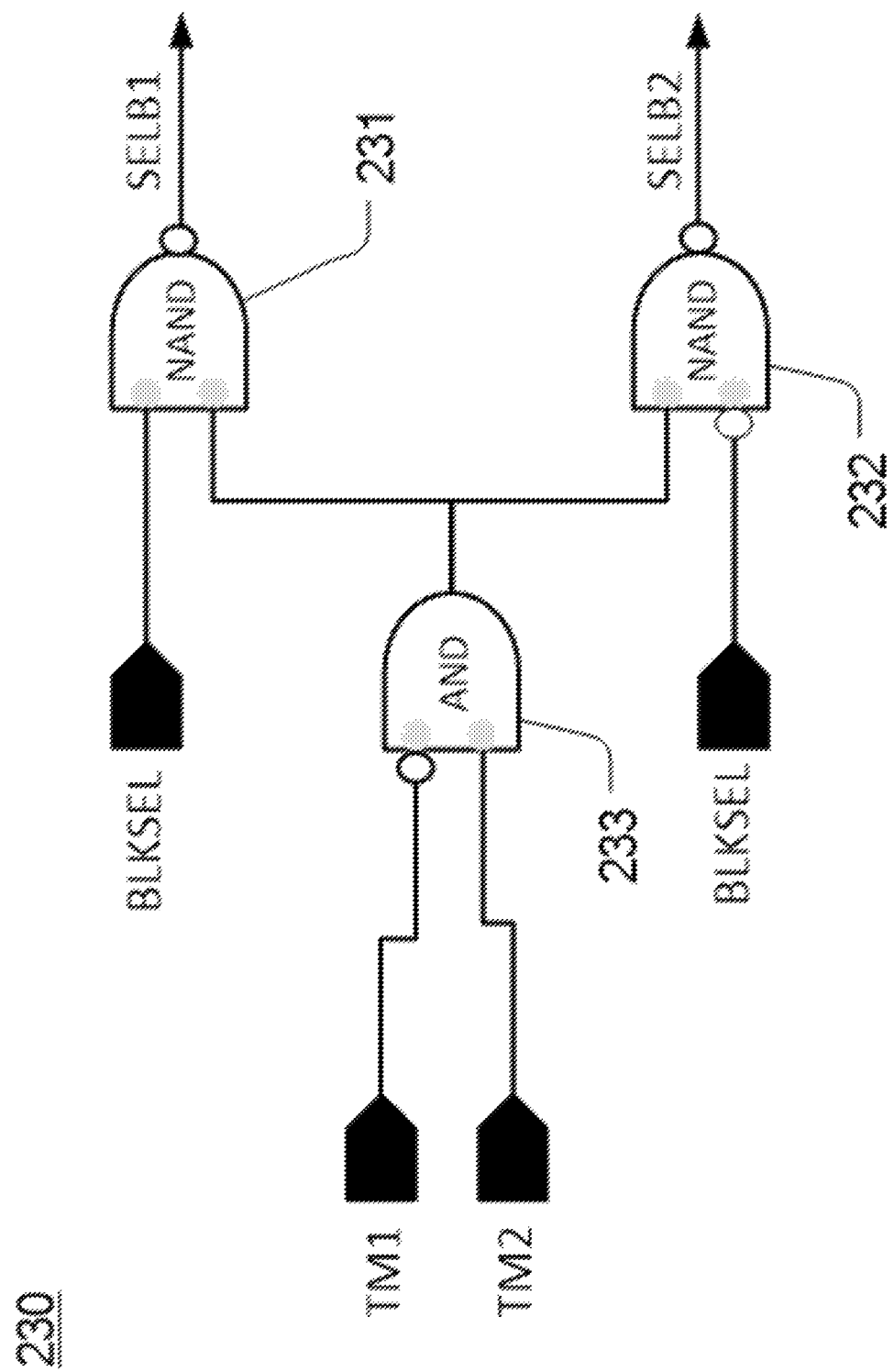
FIG. 7 is a circuit diagram of a block selection unit of a memory device in some embodiments of the present disclosure.

FIG. 7 shows a circuit structure of the block selection unit 230. The block selection unit 230 includes a fourth logic AND gate 233, a first logic NAND gate 231, and a second logic NAND gate 232.

The fourth logic AND gate 233 is connected to the test mode selection unit 220, and configured to perform logic AND on an inversion signal of the first test mode selection signal TM1 and the second test mode selection signal TM2 and output same. The first logic NAND gate 231 is connected to the address latch 210 and the fourth logic AND gate 233, and configured to perform logic NAND on the block selection control signal BLKSEL and the output result of the fourth logic AND gate 233 and then output same, wherein the output of the first logic NAND gate 231 is the first block selection signal SELB1. The second logic NAND gate 232 is connected to the address latch 210 and the fourth logic AND gate 233, and configured to perform logic NAND on an inversion of the block selection control signal BLKSEL and an output of the fourth logic AND gate 233 and then output same, the output of the second logic NAND gate 232 is the second block selection signal SELB2.

Further, the memory device further includes an instruction logic unit 270, that has an output enable signal port OE for inputting an output enable signal, a row address strobe signal port RAS/ for inputting a row address strobe signal, a column address strobe signal port CAS/ for inputting a column address stroke signal, and a write enable signal port WE/ for inputting a write enable signal, and output internal control signals to the address latch 210.

Table 1 also shows the relationships of the first test mode selection signal TM1 and the second test mode selection signal TM2 with respect to the test mode and input/output ports DQ of the memory device 200.

If TM1=0 and TM2=0, the memory device 200 enters the third test mode, all input/output ports DQ[0:15] of the output buffer 250 are not disabled, and each of the first input/output data IO[0:7] and the second input/output data IO[8:15] is output through a port DQ.

If TM1=0 and TM2=1, the memory device 200 enters the first test mode, the third group of input/output ports DQ[8:15] of the output buffer 250 are set to a disabled state, the first input/output data IO[4:7] (when BLKSEL=0) and the second input/output data IO[12:15] (when BLKSEL=1), are cached and output via the second group of input/output ports DQ[4:7] of the output buffer 250 as the data D[4:7]. Moreover, the first input/output data IO[0:3] (when BLKSEL=0) and the second input/output data IO[8:11] (when BLKSEL=1), are cached and output via the first group of input/output ports DQ[0:3] of the output buffer 250 as the data D[0:3]. That is, in the first test mode, the first input/output data IO[0:7] is output by the input/output ports DQ[0:7] that are not disabled when BLKSEL=0, and the second input/output data IO[8:15] is output by the input/output ports DQ[0:7] that are not disabled when BLKSEL=1.

If TM1=1 and TM2=0, the memory device 200 enters the second test sub-mode, the third group of input/output ports DQ[8:15] and the second group of input/output ports DQ[4:7] of the output buffer 250 are set in the disabled state, and the first logic processing result Out1[0:3] of the first data comparator 261 is output via the first group of input/output ports DQ[0:3] of the output buffer 250.

If TM1=1 and TM2=1, the memory device 200 enters the first test sub-mode, the third group of input/output ports DQ[8:15] and the second group of input/output ports DQ[4:7] of the output buffer 250 are set in the disabled state, and the second logic processing result Out2[0:3] of the second data comparator 262 is output via the first group of input/output ports DQ[0:3] of the output buffer 250.

Figure 8:
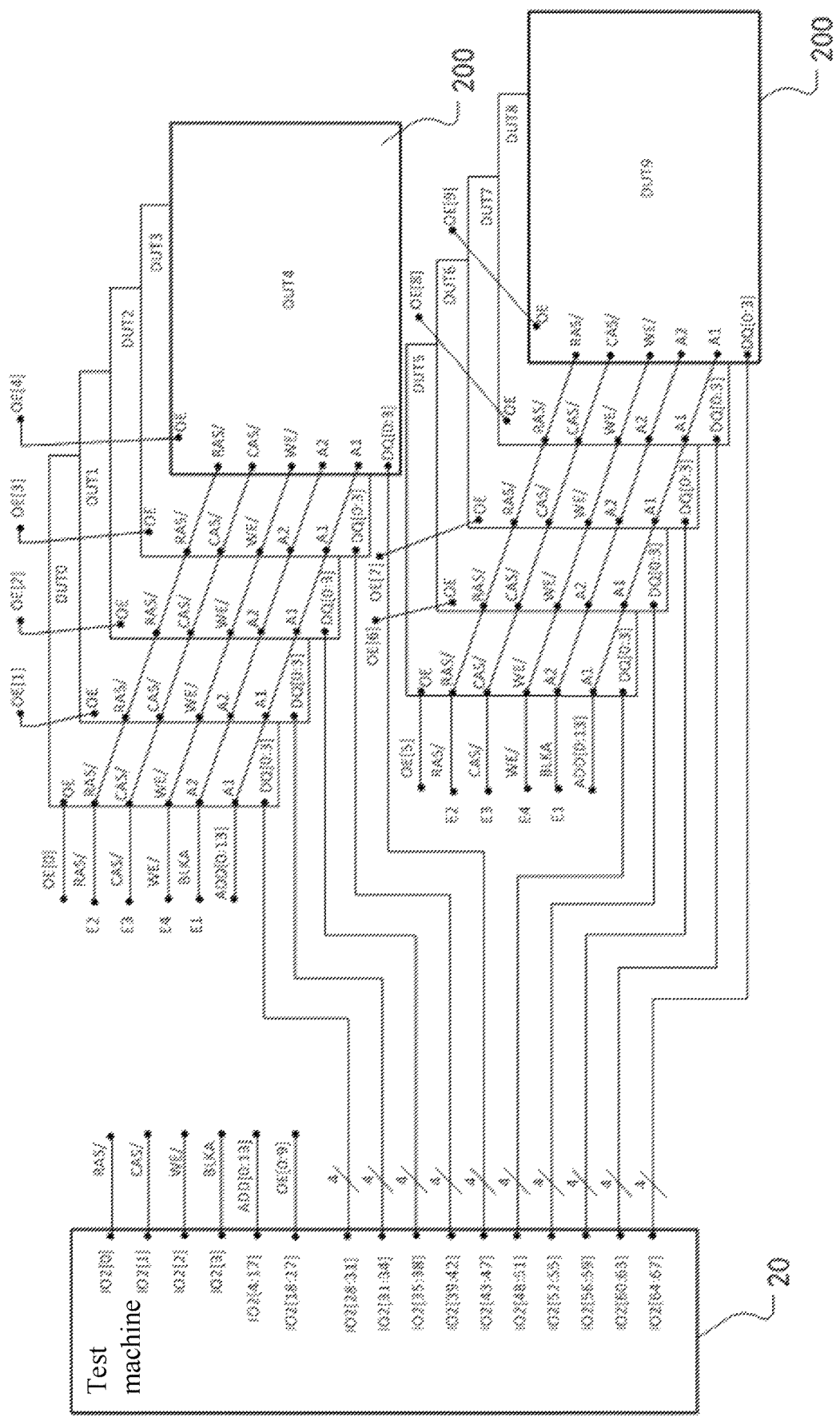
FIG. 8 is a test circuit diagram of a memory device in some embodiments of the present disclosure.

This embodiment further provides a test circuit applied to the memory device 200, including a plurality of memory devices 200 and a test machine 20 connected to the memory devices 200. As shown in FIG. 8, this embodiment is illustrated by taking ten memory devices 200 as an example, which are sequentially numbered DUT0, DUT1, DUT2, . . . , and DUT9. The test machine 20 includes a block selection enable signal output port IO2[3], wherein the block selection enable signal output port IO2[3] is configured to output the block selection enable signal BLKA. The block selection enable signal input ports A2 of each memory device 200 are connected together to form a first connection point E1, and the first connection point E1 is connected to the block selection enable signal output port IO2[3] of the test machine 20.

The ports RAS/ of each memory device 200 are connected together to form a second connection point E2, and the second connection point E2 is connected to the port IO2[0] of the test machine 20. The ports CAS/ of each memory device 200 are connected together to form a third connection point E3, and the third connection point E3 is connected to the port IO2[1] of the test machine 20. The ports WE/ of each memory device 200 are connected together to form a fourth connection point E4, and the fourth connection point E4 is connected to the port IO2[2] of the test machine 20. The address control signal input ports A1 of each memory device 200 are connected together, and then are connected to the ports IO2[4:17] of the test machine. The ports OE of each memory device 200 are respectively connected to the ports IO2[18:27] of the test machine 20. The ports IO[28:67] of the test machine 20 are connected to the input/output ports DQ[0:3] of each memory device 200.

It should be noted that the connection relationships and number of the test machine 20 and the input/output ports DQ of the memory device 200 are configured according to the test modes. When the memory device 200 enters the second test mode, the first group of input/output ports DQ[0:3] and the second group of input/output ports DQ[4:7] of the memory device 200 are connected to the test machine 20, and the input/output ports DQ of each memory device 200 only occupy eight ports of the test machine 20. When the memory device 200 enters the first test sub-mode or the second test sub-mode, the first group of input/output ports DQ[0:3] of the memory device 200 are connected to the test machine 20, and the input/output ports DQ of each memory device 200 only need to occupy four ports IO of the test machine 20.

Therefore, the memory device provided by the embodiments of the present disclosure can enter different test modes according to test requirements, share the driving devices of the test machine, occupy less ports of the test machine, and reduce the test costs.

The foregoing descriptions are merely specific embodiments of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

The invention claimed is:

1. A memory device, comprising:
an address latch comprising an address signal input port for receiving an address signal and a block selection enable signal input end for receiving a block selection enable signal, wherein the address latch outputs an address control signal and a block selection control signal;
a test mode selection unit comprising a test mode selection instruction input port for receiving a test mode selection instruction signal, wherein the test mode selection unit outputs a test mode selection signal according to the test mode selection instruction signal;
a block selection unit connected to the address latch and the test mode selection unit, wherein the block selection unit is configured to output a block selection signal according to the block selection control signal and the test mode selection signal;
a first storage module connected to the block selection unit and the address latch and configured to decode the address control signal and to output a first input/output data when the first storage module is enabled according to the block selection signal;
a second storage module connected to the block selection unit and the address latch and configured to decode the address control signal and to output a second input/output data when the second storage module is enabled according to the block selection signal;
an output buffer comprising a plurality of input/output ports, wherein the output buffer is connected to the test mode selection unit, the first storage module, and the second storage module, and when the memory device enters a first test mode according to the test mode selection signal, the output buffer disables a first portion of the input/output ports and sequentially outputs the first input/output data and the second input/output data through un-disabled input/output ports of the first test mode; and
a test mode read-write logic unit connected between the first storage module and the output buffer, and between the second storage module and the output buffer, and to the address latch and the test mode selection unit, wherein the test mode read-write logic unit is configured to perform logic processes on the first input/output data and the second input/output data according to the block selection control signal and the test mode selection signal to obtain a logic processing result,
wherein when the memory device enters a second test mode according to the test mode selection signal, the output buffer disables a second portion of the input/output ports and outputs the logic processing result through un-disabled input/output ports of the second mode.

2. The memory device according to claim 1, wherein the second test mode comprises a first test sub-mode and a second test sub-mode;
when the memory device enters the first test sub-mode according to the test mode selection signal, the test mode read-write logic unit is configured to perform logic exclusive-OR (XOR) on the first input/output data with an expected data and the second input/output data with the expected data to obtain a first logic result;
when the memory device enters the second test sub-mode according to the test mode selection signal, the test mode read-write logic unit is configured to perform logic XOR on the first input/output data and the second input/output data to obtain a second logic result.

3. The memory device according to claim 2, wherein the test mode read-write logic unit comprises:
a register configured to output the expected data;
a first data comparator connected to the register, the first storage module, and the second storage module, wherein the first data comparator is configured to perform logic XOR on the first input/output data with the expected data and the second input/output data with the expected data to obtain the first logic result;
a second data comparator connected to the first storage module and the second storage module, wherein the second data comparator is configured to perform logic XOR on the first input/output data and the second input/output data to obtain the second logic result; and a multiplexer comprising an input port connected to the first data comparator, the second data comparator, the test mode selection unit, and an output port connected to the output buffer, wherein the multiplexer is configured to output one of the first logic result and the second logic result according to the test mode selection signal.

4. The memory device according to claim 1, wherein the output buffer comprises:

a first buffer group comprising a plurality of first buffers, input ports of the plurality of first buffers being connected to the first storage module, and output ports of the plurality of first buffers forming a first group of input/output ports, wherein the output ports of the first buffers are un-disable;

a second buffer group comprising a plurality of second buffers, input ports of the plurality of second buffers being connected to the first storage module, and output ports of the plurality of second buffers forming a second group of input/output ports, wherein the output ports of the second buffers are disabled according to the test mode selection signal; and a third buffer group comprising a plurality of third buffers, input ports of the plurality of third buffers being connected to the second storage module, and output ports of the plurality of third buffers forming a third group of input/output ports, wherein the output ports of the third buffers are disabled according to the test mode selection signal.

5. The memory device according to claim 1, wherein the test mode selection instruction signal comprises an initial test mode signal, a fuse signal, and a test mode control signal, wherein the initial test mode signal is from an internal circuit of the memory device, the test mode control signal is from an external test signal, an enabling priority of the test mode control signal is higher than an enabling priority of the fuse signal, and the enabling priority of the fuse signal is higher than an enabling priority of the initial test mode signal.

6. The memory device according to claim 5, wherein the test mode selection unit comprises at least one test mode selection subunit, wherein the at least one test mode selection subunit comprises:

a fuse circuit configured to output the fuse signal and a fuse enable signal according to a fuse state;

a first multiplexer comprising a first input port and a second input port for inputting the initial test mode signal and the fuse signal, respectively, the first multiplexer configured to output one of the fuse signal and the initial test mode signal according to the fuse enable signal;

a test mode control unit configured to output the test mode control signal and a test mode enable signal; and a second multiplexer connected to the first multiplexer and the test mode control unit and configured to output the test mode selection signal, wherein the test mode selection signal is one of the test mode control signal and an output signal of the first multiplexer according to the test mode enable signal.

7. The memory device according to claim 1, wherein, when the memory device enters a third test mode according to the test mode selection signal, the output buffer enables all the input/output ports and outputs the first input/output data and the second input/output data through all the input/output ports.

8. The memory device according to claim 1, wherein the test mode selection signal comprises a first test mode selection signal and a second test mode selection signal, and the block selection unit comprises:

a logic AND gate connected to the test mode selection unit and configured to perform logic AND on the second test mode selection signal and an inversion of the first test mode selection signal and to output an result thereof;

a first logic NAND gate connected to the address latch and the logic AND gate and configured to perform logic NAND on the block selection control signal and an output of the logic AND gate for obtaining a first block selection signal, and to output the first block selection signal; and a second logic NAND gate connected to the address latch and the logic AND gate and configured to perform logic NAND on the output of the logic AND gate and an inversion of the block selection control signal for obtaining a second block selection signal, and to output the second block selection signal.

9. A test circuit, comprising a plurality of memory devices including the memory device according to claim 1 and a test machine connected to some of the input/output ports of the plurality of memory devices.

10. The test circuit according to claim 9, wherein the test machine comprises a block selection enable signal output port for outputting the block selection enable signal, block selection enable signal input ports of the plurality of memory devices are connected to form a first connection point, and the first connection point is connected to the block selection enable signal output port of the test machine.

11. The test circuit according to claim 9, wherein each of the plurality of memory devices has a row address strobe signal port, a column address strobe signal port, and a write enable signal port; the row address strobe signal ports of the plurality of memory devices are connected to form a second connection point; the column address strobe signal ports of the plurality of memory devices are connected to form a third connection point; the write enable signal ports of the plurality of memory devices are connected to form a fourth connection point; and the second connection point, the third connection point, and the fourth connection point are connected to input/output ports of the test machine, respectively.

12. A memory device, comprising:

an address latch comprising an address signal input port for receiving an address signal and a block selection enable signal input end for receiving a block selection enable signal, wherein the address latch outputs an address control signal and a block selection control signal;

a test mode selection unit comprising a test mode selection instruction input port for receiving a test mode selection instruction signal, wherein the test mode selection unit outputs a test mode selection signal according to the test mode selection instruction signal;

a block selection unit connected to the address latch and the test mode selection unit, wherein the block selection unit is configured to output a block selection signal according to the block selection control signal and the test mode selection signal;

a first storage module connected to the block selection unit and the address latch and configured to decode the address control signal and to output a first input/output data when the first storage module is enabled according to the block selection signal;

a second storage module connected to the block selection unit and the address latch and configured to decode the address control signal and to output a second input/output data when the second storage module is enabled according to the block selection signal;

an output buffer comprising a plurality of input/output ports, wherein the output buffer is connected to the test mode selection unit, the first storage module, and the second storage module, and when the memory device enters a first test mode according to the test mode selection signal, the output buffer disables a portion of the input/output ports and sequentially outputs the first input/output data and the second input/output data through un-disabled input/output ports, wherein the test mode selection signal comprises a first test mode selection signal and a second test mode selection signal, and the block selection unit comprises:

a logic AND gate connected to the test mode selection unit and configured to perform logic AND on the second test mode selection signal and an inversion of the first test mode selection signal and to output an result thereof;

a first logic NAND gate connected to the address latch and the logic AND gate and configured to perform logic NAND on the block selection control signal and an output of the logic AND gate for obtaining a first block selection signal, and to output the first block selection signal; and a second logic NAND gate connected to the address latch and the logic AND gate and configured to perform logic NAND on the output of the logic AND gate and an inversion of the block selection control signal for obtaining a second block selection signal, and to output the second block selection signal.

13. A memory device, comprising:

an address latch comprising an address signal input port for receiving an address signal and a block selection enable signal input end for receiving a block selection enable signal, wherein the address latch outputs an address control signal and a block selection control signal;

a test mode selection unit comprising a test mode selection instruction input port for receiving a test mode selection instruction signal, wherein the test mode selection unit outputs a test mode selection signal according to the test mode selection instruction signal;

a block selection unit connected to the address latch and the test mode selection unit, wherein the block selection unit is configured to output a block selection signal according to the block selection control signal and the test mode selection signal;

a first storage module connected to the block selection unit and the address latch and configured to decode the address control signal and to output a first input/output data when the first storage module is enabled according to the block selection signal;

a second storage module connected to the block selection unit and the address latch and configured to decode the address control signal and to output a second input/output data when the second storage module is enabled according to the block selection signal;

an output buffer comprising a plurality of input/output ports, wherein the output buffer is connected to the test mode selection unit, the first storage module, and the second storage module, and when the memory device enters a first test mode according to the test mode selection signal, the output buffer disables a portion of the input/output ports and sequentially outputs the first input/output data and the second input/output data through un-disabled input/output ports, wherein the test mode selection instruction signal comprises an initial test mode signal, a fuse signal, and a test mode control signal, wherein the initial test mode signal is from an internal circuit of the memory device, the test mode control signal is from an external test signal, an enabling priority of the test mode control signal is higher than an enabling priority of the fuse signal, and the enabling priority of the fuse signal is higher than an enabling priority of the initial test mode signal, and wherein the test mode selection unit comprises at least one test mode selection subunit, wherein the at least one test mode selection subunit comprises:

a fuse circuit configured to output the fuse signal and a fuse enable signal according to a fuse state;

a first multiplexer comprising a first input port and a second input port for inputting the initial test mode signal and the fuse signal, respectively, the first multiplexer configured to output one of the fuse signal and the initial test mode signal according to the fuse enable signal;

a test mode control unit configured to output the test mode control signal and a test mode enable signal; and a second multiplexer connected to the first multiplexer and the test mode control unit and configured to output the test mode selection signal, wherein the test mode selection signal is one of the test mode control signal and an output signal of the first multiplexer according to the test mode enable signal.

* * * * *